(12) United States Patent
Andric et al.

(10) Patent No.: US 6,364,669 B1
(45) Date of Patent: Apr. 2, 2002

(54) SPRING CONTACT FOR PROVIDING HIGH CURRENT POWER TO AN INTEGRATED CIRCUIT

(75) Inventors: Anthony Andric, Lockhart; Ruel Hill, Austin, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/614,817

(22) Filed: Jul. 12, 2000

(51) Int. Cl.[7] .............................................. H01R 12/00
(52) U.S. Cl. ........................................ 439/70; 174/52.4
(58) Field of Search ............................ 439/70, 67, 71, 439/68, 92; 174/260, 52.2, 52.3, 52.4; 361/702, 803, 784, 785–789

(56) References Cited

U.S. PATENT DOCUMENTS

| | | | | |
|---|---|---|---|---|
| 4,939,570 A | * | 7/1990 | Bickford et al. | 357/81 |
| 5,061,686 A | * | 10/1991 | Ruby | 565/1 |
| 5,239,198 A | * | 8/1993 | Lin et al. | 257/693 |
| 5,486,723 A | * | 1/1996 | Ma et al. | 257/707 |
| 5,528,083 A | * | 6/1996 | Malladi et al. | 257/786 |
| 5,545,045 A | * | 8/1996 | Wakamatsu | 439/70 |
| 5,744,863 A | * | 4/1998 | Culnane et al. | 257/712 |
| 5,923,086 A | * | 7/1999 | Winer et al. | 257/713 |
| 5,982,018 A | * | 11/1999 | Wark et al. | 257/532 |

* cited by examiner

Primary Examiner—Brian Sircus
Assistant Examiner—Son V. Nguyen

(57) ABSTRACT

An integrated circuit package includes a semiconductor die, a base, and a plurality of external contacts. The base is coupled to the semiconductor die and includes at least one contact pad coupled to the semiconductor die. The plurality of external contacts extend from the base and are coupled to the semiconductor die. A circuit assembly includes a printed circuit board, an integrated circuit package, and a socket. The integrated circuit package includes a semiconductor die, a base coupled to the semiconductor die, and a plurality of external contacts extending from the base and being coupled to the semiconductor die. The base includes at least one contact pad coupled to the semiconductor die. The socket is coupled to the printed circuit board and adapted to receive the base. A contact is adapted to interface with the contact pad and one of the printed circuit board and the socket.

10 Claims, 3 Drawing Sheets

SPRING CONTACT FOR PROVIDING HIGH CURRENT POWER TO AN INTEGRATED CIRCUIT

BACKGROUND OF THE INVENTION

1. Field of the Invention

This invention relates generally to the field of electrical connectors for semiconductor devices and, more particularly, to a spring contact for providing high current power to an integrated circuit.

2. Description of the Related Art

Typically, electrical connectors having various configurations are employed for attaching integrated-circuit (IC) modules to printed-circuit (PC) boards. Such connectors provide versatility to computer platforms by allowing major components, such as microprocessors, to be easily removed and replaced with upgraded units. For example, one type of connector that is used for such a purpose is a zero-insertion-force (ZIF) sockets. A ZIF socket is useful in that very little downward force need be exerted as the device is being inserted or latched into the connector. Because virtually no force is required, the potential for damage to the delicate signal pins of the component being inserted is reduced. The type of semiconductor device package that interfaces with a ZIF socket is referred to a pin grid array (PGA). A PGA package has a plurality of signal and power pins extending from the package, typically in a single plane.

One problem associated with a PGA package is the limited current carrying capacity of each pin. Accordingly, many pins are needed to provide sufficient power and ground supplies for the semiconductor device. As the complexity of current microprocessors increases, the power demands typically also increase. In addition, the number of pins needed for signals also increases (e.g., a 64-bit microprocessor required more pins than a 32-bit microprocessor). Due to the current requirements of typical microprocessors, as many as ⅔ of the total number of pins may be dedicated for supplying power. This domination of the pins count constrains the number of pins remaining for signals. Additional pins equate to additional size and cost. The use of larger pins for power supply contacts to boost their current carrying capacity is impractical as it increases the complexity of the assembly process.

The present invention is directed to overcoming, or at least reducing the effects of, one or more of the problems set forth above.

SUMMARY OF THE INVENTION

One aspect of the present invention is seen in an integrated circuit package including a semiconductor die, a base, and a plurality of external contacts. The base is coupled to the semiconductor die and includes at least one contact pad coupled to the semiconductor die. The plurality of external contacts extend from the base and are coupled to the semiconductor die.

Another aspect of the present invention is seen in a circuit assembly including a printed circuit board, an integrated circuit package, and a socket. The integrated circuit package includes a semiconductor die, a base coupled to the semiconductor die, and a plurality of external contacts extending from the base and being coupled to the semiconductor die. The base includes at least one contact pad coupled to the semiconductor die. The socket is coupled to the printed circuit board and adapted to receive the base. A contact is adapted to interface with the contact pad and one of the printed circuit board and the socket.

BRIEF DESCRIPTION OF THE DRAWINGS

The invention may be understood by reference to the following description taken in conjunction with the accompanying drawings, in which like reference numerals identify like elements, and in which.

Figure 1:
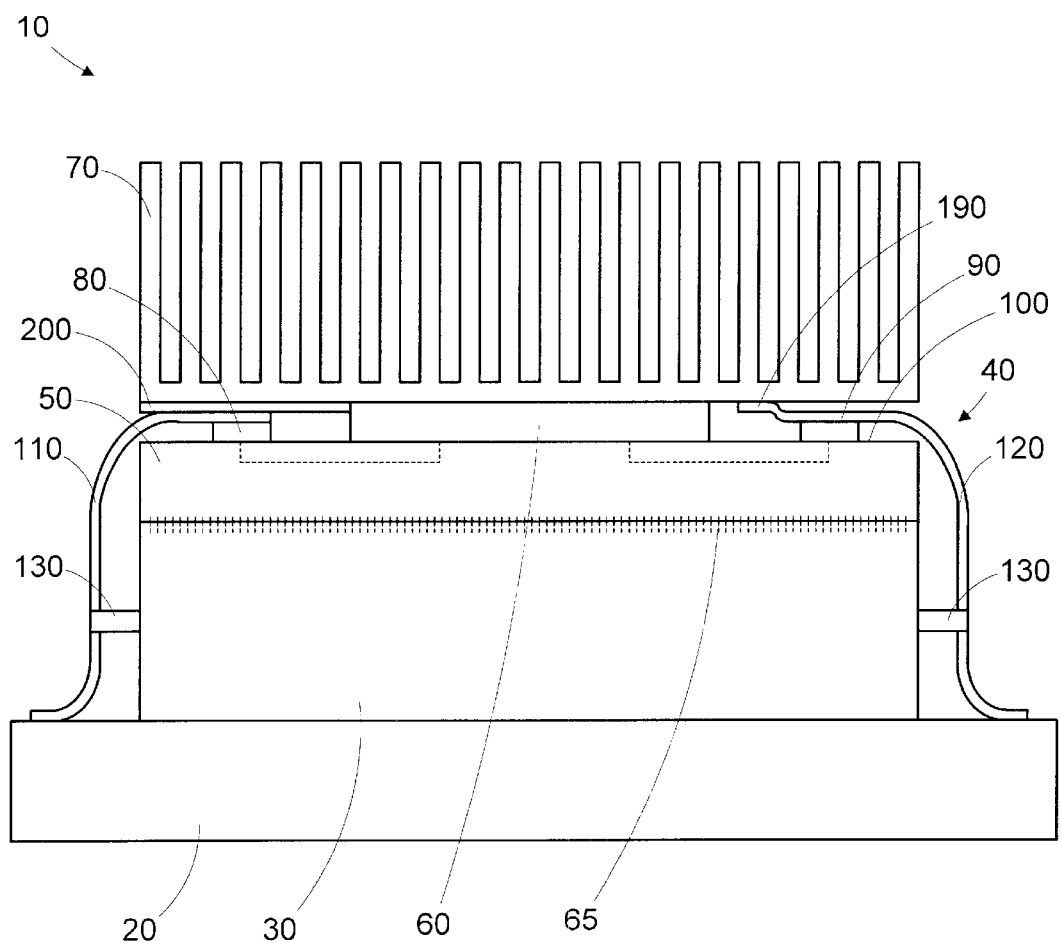
FIG. 1 is side view of a circuit assembly in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a side view of a circuit assembly 10 in accordance with the present invention is shown. The circuit assembly 10 includes a printed circuit board 20, to which a socket 30 is mounted. In the illustrated embodiment, the socket 30 is a ZIF socket adapted to receive a pin grid array package, although other types of sockets may be used. An integrated circuit package 40, including a ceramic base 50 and a semiconductor die 60, is coupled to the socket 30. In the illustrated embodiment, the ceramic base 50 includes a plurality of contact pins 65 that engage the socket 30 using a conventional pin grid array configuration. The semiconductor die 60 is coupled to the ceramic base 50 using one of a number of conventional flip chip bonding processes well known to those of ordinary skill in the art. The contact pins 65 communicate logic signals between the printed circuit board 20 and the semiconductor die 60. A heat sink 70 is coupled to the semiconductor die 60 for dissipating heat generated therein.

In accordance with the present invention, contact pads 80, 90 are formed on an upper surface 100 of the ceramic base 50. The contact pads 80, 90 are coupled to the semiconductor die 60 as represented by the dashed line connection. In the illustrated embodiment, the contact pads 80, 90 are solder pads formed during the soldering of other circuitry (not shown) on the upper surface 100. Spring contacts 110, 120 are coupled to the printed circuit board 20 and interface with the contact pads 80, 90. It is also contemplated that the spring contacts 110, 120 may be mounted to the contact pads 80, 90 and interface with the printed circuit board 20. In an alternative embodiment, illustrated in FIG. 2, the spring contacts 110, 120 extend from the socket 30 to interface with the contact pads 80, 90.

The spring contacts 110, 120 may be constructed of a spring metal. Although the contacts 110, 120 are is illustrated as being spring type contacts, the application of the present invention is not so limited, and other contact types may be used. The spring contacts 110, 120 have a higher current-carrying capacity than the contact pins 65 of the ceramic base 50, and, hence, are useful for providing power and ground signals to the semiconductor die 60. Supplying power and ground signals through the spring contacts 110, 120, as opposed to the contact pins 65 of the ceramic base 50, frees up contact pin resources for carrying additional logic signals without requiring an increase in die size.

Figure 2:
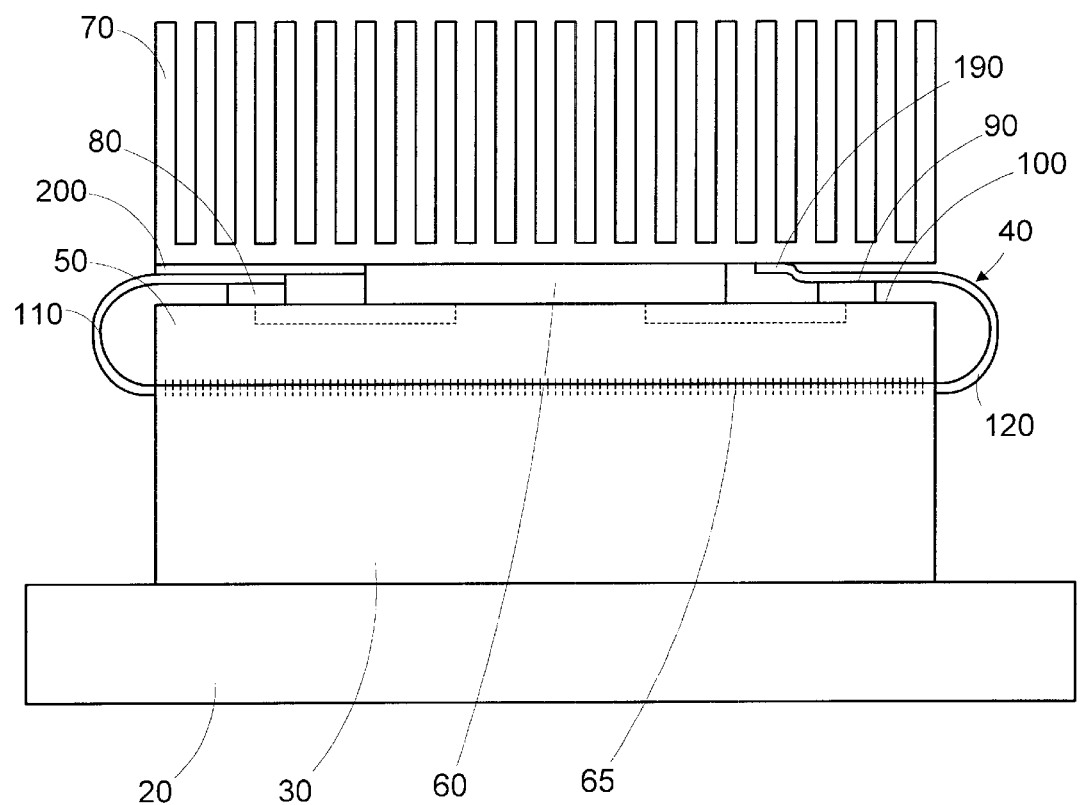
FIG. 2 is side view of a circuit assembly in accordance with an alternative embodiment of the present invention.

The particular number of contact pads 80, 90 and corresponding spring contacts 110, 120 is application dependent, and may vary, depending on factors such as the layout of the semiconductor die 60 and the power requirements of the semiconductor die 60. To enhance the corrosion resistance of the spring contacts 110, 120, they may be gold plated. Many different constructs for the spring contacts 110, 120 are possible. The illustrated exemplary spring contacts 110, 120 of FIG. 1 have a roughly s-shaped cross section. Other cross sections, such as c-shaped (as shown in FIG. 2) or rectangular may be used.

Figure 3A:
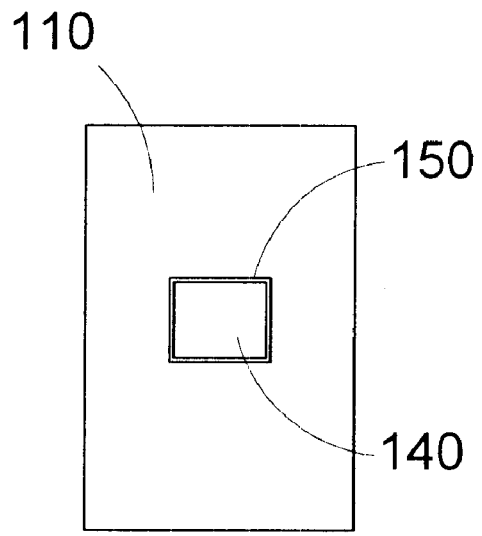
FIGS. 3A and 3B are end and cross section views, respectively, of two embodiments of a spring contact and retaining tab of the circuit assembly of FIG. 1 for providing high current power to a semiconductor device.
Figure 3B:
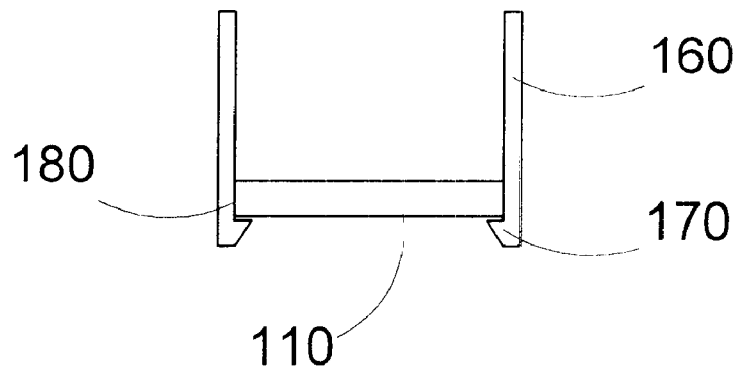

In the embodiment of FIG. 1, alignment tabs 130 extend from the socket 30 to engage the spring contacts 110, 120 to inhibit lateral motion thereof. Turning briefly to FIGS. 3A and 3B, alternative embodiments of the alignment tabs 130 are shown. In the embodiment of FIG. 3A, the alignment tab 130 comprises a pin 140 extending from the socket 30 to engage a corresponding notch 150 defined in the spring contact 110. Although, the pin 140 and notch 150 are shown having rectangular shapes, other shapes, such as circular, may be used.

In the embodiment of FIG. 3B, the alignment tab 130 comprises a pair of clips 160 having ramped ends 170 extending from the socket 30 to engage the sides 180 of the spring contact 110. When the spring contact 110 is inserted between the clips 160, the ramped ends 170 cause the clips 160 to deflect, allowing the spring contact 110 to be inserted past the ends 170. After the spring contact 110 passes the ends 170, the deflection force is removed, and the ends 170 retain the spring contact 110 in place.

Returning now to FIG. 1, the spring contact 120 associated with the ground power supply signal has an upwardly turned tip 190 that interfaces with the heat sink 70. The heat sink 70 is grounded to reduce electromagnetic emissions. Using the tip 190 of the spring contact 120 accomplishes this function without requiring an additional connection.

The spring contact 110 associated with the power signal is insulated from the heat sink 70 by an insulative layer 200. An insulating tape, such as Mylar® tape is one material suitable for acting as the insulative layer 200. The insulative layer 200 may be attached to either the spring contact 110 or to the heat sink 70. Of course, any number of other suitable insulative layers may be used. If sufficient clearance exists between the heat sink 70 and the spring contact 110, the insulative layer 200 may be omitted.

The circuit assembly 10 described herein is advantageous in that the spring contacts 110, 120 allow transmission of power and ground supply signals to the semiconductor die 60 without tying up a large number of contact pins in the socket 30. Conserving contact pins allows for increased capabilities of the semiconductor die 60 without consuming valuable real estate for the multitude of power and ground contacts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A circuit assembly, comprising:

a printed circuit board;

an integrated circuit package, comprising:
   a semiconductor die;
   a base having a first surface and a second surface, the first surface being coupled to the semiconductor die and including at least one contact pad electrically coupled to the semiconductor die; and
   a plurality of external contacts extending from the second surface of the base and being electrically coupled to the semiconductor die;

a socket coupled between the printed circuit board and the base; and a contact having a first end coupled to the contact pad and a second end coupled to the socket.

2. The circuit assembly of claim 1, wherein the contact coupled between the printed circuit board comprises a spring contact.

3. The circuit assembly of claim 1, further comprising a heat sink mounted to the semiconductor die.

4. The circuit assembly of claim 3, wherein the contact comprises a ground contact and is adapted to interface with the heat sink.

5. The circuit assembly of claim 3, wherein the contact comprises a power contact, and the circuit assembly further comprises an insulative layer disposed between the contact and the heat sink.

6. The circuit assembly of claim 1, wherein the external contacts comprise pin contacts.

7. The circuit assembly of claim 1, wherein the contact pad has a higher current-carrying capacity than individual external contacts.

8. The circuit assembly of claim 7, wherein the external contacts comprise signal contacts, and the contact pad comprises at least one of a power and a ground contact.

9. The circuit assembly of claim 1, wherein the base includes a plurality of contact pads.

10. The semiconductor device of claim 9, wherein the contact pads comprise power and ground contacts.

* * * * *